US006833180B1

(12) United States Patent
Kodemura

(10) Patent No.: US 6,833,180 B1
(45) Date of Patent: Dec. 21, 2004

(54) ADHESIVE FOR SEMICONDUCTOR PART

(75) Inventor: Junji Kodemura, Kanagawa (JP)

(73) Assignee: Nippon Zeon Company, Ltd., Tokyo (JP)

( * ) Notice: Subject to any disclaimer, the term of this patent is extended or adjusted under 35 U.S.C. 154(b) by 0 days.

(21) Appl. No.: 09/462,214

(22) PCT Filed: Jul. 6, 1998

(86) PCT No.: PCT/JP98/03033

§ 371 (c)(1),
(2), (4) Date: Jan. 4, 2000

(87) PCT Pub. No.: WO99/01519

PCT Pub. Date: Jan. 14, 1999

(30) Foreign Application Priority Data

Jul. 4, 1997 (JP) .............................................. 9-195066

(51) Int. Cl.[7] .......................... B32B 3/00; B32B 27/04; C09J 5/06
(52) U.S. Cl. .................... 428/220; 428/320.2; 428/323; 428/327; 428/328; 428/414; 428/416; 428/457; 428/461; 428/462; 428/500; 428/521; 156/306.6; 156/306.9; 156/311; 156/327
(58) Field of Search .......................... 156/306.6, 306.9, 156/311, 327; 428/457, 320.2, 500, 414, 416, 418, 462, 461, 521, 220, 323, 327, 328

(56) References Cited

U.S. PATENT DOCUMENTS

| | | | | |
|---|---|---|---|---|
| 4,113,981 A | * | 9/1978 | Fujita et al. | 174/88 R |
| 5,179,171 A | * | 1/1993 | Minami et al. | 525/288 |
| 5,783,639 A | * | 7/1998 | Kataoka et al. | 525/286 |
| 5,879,786 A | * | 3/1999 | Budnaitis et al. | 428/209 |
| 5,912,313 A | | 6/1999 | McIntosh, III et al. | 526/279 |
| 6,223,429 B1 | * | 5/2001 | Kaneda et al. | 29/832 |

FOREIGN PATENT DOCUMENTS

| | | |
|---|---|---|
| EP | 0203799 | 12/1986 |
| EP | 0227002 | 7/1987 |
| JP | 62-27412 | 2/1987 |
| JP | 62-243668 | 10/1987 |
| JP | 2-36224 | 2/1990 |
| JP | 2-133406 | 5/1990 |
| JP | 2-305814 | 12/1990 |
| JP | 3-72512 | 3/1991 |
| JP | 3-74409 | 3/1991 |
| JP | 3-95286 | 4/1991 |
| JP | 4-288342 | 10/1992 |
| JP | 5-271356 | 10/1993 |
| JP | 5-320268 | 12/1993 |
| JP | 6-172423 | 6/1994 |
| JP | 7-258318 | 10/1995 |
| JP | 8-239642 | 9/1996 |
| JP | 10-241461 | 9/1998 |
| JP | 10-251606 | 9/1998 |
| WO | WO9720871 | 6/1997 |

OTHER PUBLICATIONS

Japanese Publication, *Society of Industrial Research: Society for Hybrid Microelectronics*, vol. 4, Chapter 6, pp. 212–213 (1995).
Derwent Abstract AN 1991–278329 of JP 3–185013 (1991).
Derwent Publication AN 1990–339177 of JP 2–245071 (Sep. 28, 1990).

* cited by examiner

Primary Examiner—Monique R. Jackson
(74) Attorney, Agent, or Firm—Dinsmore & Shohl LLP

(57) ABSTRACT

An adhesive for semiconductor parts, comprising, as a base polymer, at least one cyclic structure-containing thermoplastic polymer selected from the group consisting of (a) a cycloolefin polymer and (b) an aromatic-condensed polymer having a repeating unit of an aromatic ring in its main chain, and having a number average molecular weight of 1,000 to 500,000, an adhesive sheet formed of the adhesive, a semiconductor part package making use of the adhesive, and a production process of the package.

26 Claims, 1 Drawing Sheet

ADHESIVE FOR SEMICONDUCTOR PART

TECHNICAL FIELD

The present invention relates to an adhesive for semiconductor parts, and more particularly to an adhesive for semiconductor parts, which comprises a cyclic structure-containing thermoplastic polymer as a base polymer and has excellent shelf stability, adhesive property, heat resistance, moisture resistance, low water absorption property, dielectric properties (low dielectric constant and dielectric loss tangent), productivity, mechanical properties and long-term reliability. The present invention also relates to a production process of a semiconductor part package, comprising the step of bonding a semiconductor part to a wiring board (substrate) with such an adhesive. The present invention further relates to a semiconductor part package bonded with such an adhesive.

BACKGROUND ART

With the rapid advancement of advanced information-oriented society in recent years, there is a strong demand for the enhancement of throughput capacity of information processing apparatus such as computers and communication apparatus, i.e., the speeding up. In addition, their miniaturization and weight saving are required so as to be portable.

Of these requirements, in order to achieve the speeding up of the information processing, it is effective to make the interconnected wiring of passive parts and active parts such as LSI, memory and so as short as possible so as to make wiring density high in packaging of semiconductor parts mounted in an apparatus. This technique is also effective for the miniaturization and weight saving of information processing apparatus.

As a means for shortening the distance of the interconnected wiring, there is bare chip mounting in which semiconductor chips are directly mounted on a substrate. In particular, flip chip bonding (FC) in which an electrode of a semiconductor chip (semiconductor integrated circuit device) and an electrode of a wiring board are directly bonded to each other through bumps (fine metal projections; for example, Au bumps or solder bumps) is the most effective process.

In the flip chip bonding, metallurgical bonding making good use of a metallic material such as an Sn—Pb solder has been mainly used. More specifically, when a semiconductor chip is mounted on a wiring board, the semiconductor chip is placed on a conductive pattern of the wiring board to conduct solder bonding. In the soldering process, it is necessary to conduct flow soldering subsequently to reflow soldering. Therefore, the process is complicated, and any part poor in heat resistance cannot be mounted. In addition, since joints in the adhesion or bonding of semiconductor parts are increasingly made small, the processing by the solder bonding becomes difficult.

In order to meet requirements such as high-density packaging and miniaturization of electronic apparatus, enhancement of electrical performance, reduction in production cost and automization of packaging, various surface mounting techniques including non-metallurgical bonding have therefore been developed. For example, a method, in which bumps are formed on a semiconductor chip, an insulating resin layer is formed on a wiring board, and both semiconductor chip and wiring board are headed and press-bonded to each other, thereby directly bonding an electrode of the semiconductor chip to an electrode of the wiring board in a shortest distance through bumps, is put to practical use. The insulating resin layer is generally formed by a thermosetting resin having adhesive property, such as an epoxy resin, and so adhesion between the semiconductor chip and the wiring board by the setting of the resin is conducted at the same time as the bonding between the electrodes.

Besides, a method, in which bumps are formed on a semiconductor chip, an anisotropic conductive film is interposed in a space between the semiconductor chip and a conductive pattern on a wiring board, and both chip and board are pressed against each other, thereby press-bonding the bumps of the semiconductor chip to the conductive pattern on the wiring board to form electrical connection, has been developed. The anisotropic conductive layer is generally formed by an anisotropic conductive material obtained by dispersing a conductive filler such as metallic fine particles or resin balls (fine particles), on the surfaces of which a conductive film has been provided, in a binder resin. In the bonding mechanism making use of the anisotropic conductive material, the conductive filler dispersed in the anisotropic conductive material is present on connection terminals with a certain probability, and the conductive filler is squeezed from point contact to a state close to face contact by applying heat and pressure upon bonding, thereby giving conductivity and at the same time fully bonding the chip to the wiring board to achieve stable bonding. If the filling amount of the conductive filler is too great, interterminal leakage and lowering of adhesive force are incurred. If the amount is too small on the other hand, a problem arises on connection resistance. More specifically, lateral insulation property and conductivity between upper and lower terminals are balanced by controlling the amount of the conductive filler dispersed. In addition, the adhesive force is controlled.

The non-metallurgical bonding using the insulating resin or anisotropic conductive material has a merit that the bonding can be conducted at a relatively low temperature compared with the solder bonding. According to the packaging by the non-metallurgical bonding, the limitation of materials to be bonded is relaxed compared with the solder bonding, and application range thereof is widened. The requirement of heat resistance to the parts and boards (substrates) can also be relaxed due to bonding at a lower temperature, and moreover packaging cost can be reduced because washing-out of flux is unnecessary.

In the non-metallurgical bonding, thermosetting resins and ultraviolet-curing resins have heretofore been commonly used as the insulating resins or binder resins from the viewpoints of adhesive property and heat resistance. However, the bonding using the thermosetting resin or ultraviolet-curing resin has involved a problem of repairability against bonding failure occurred in a packaging process. More specifically, it is extremely difficult to repair a defective unit when such a resin is cured by heating and pressing (pressurizing) or irradiation of ultraviolet light upon bonding. Even if a semiconductor chip can be separated from a wiring board, it is difficult to remove residue of the cured resin. In the case of a semiconductor package, to scrap the whole package due to a partial defect results in a great loss of cost. Accordingly, there is a demand for establishing techniques such as repair of wiring, and exchange and reuse of semiconductor chips.

In these application fields, thermosetting epoxy resins (adhesives) have heretofore been particularly preferably used because variations of its connection resistance value under high-temperature conditions are little. The epoxy resins are roughly divided into one-pack type that a main material is mixed with a hardener in advance, and two-pack type that a main material is mixed with a hardener upon use. However, in the case of the one-pack type epoxy resins in which the main material is mixed with the hardener in advance, most of them must be stored under refrigeration in order to prevent the reaction of the main material with the hardener before use. Since the one-pack type epoxy resins are cured at a low temperature, their pot life at room temperature is at most about 1 day. Even when they are stored under refrigeration, the pot life is about 2 to 3 months. In addition, their workability is poor because the temperature must be returned to room temperature upon use. Further, the one-pack type epoxy resins involve a problem that they take up moisture when the temperature is returned to room temperature to deteriorate their properties.

On the other hand, in the case where that the two-pack type epoxy resins in which the main material is mixed with the hardener upon use, there is a problem that their workability is poor because the main material must be mixed with the hardener at every use. In the joining and adhesive bonding with such an adhesive, a coating technique for quickly and exactly applying the adhesive is important for the purpose of joining or adhesive bonding many parts in a short period of time. A screen printing method or an ejection method by a dispenser is generally applied. Occurrence of coat mottle becomes a problem when these methods are applied. The two-pack type epoxy resins are difficult to control their coating weights and hence involve a problem that coating mottle tends to occur, and stable adhesion is infeasible.

As the common problem before the one-pack type and two-pack type epoxy resins, there is a problem that it takes a long time to cure them, namely, the productivity is low. In addition, the insulating resin or anisotropic conductive material may be required in some cases to be used in the form of a film or sheet, and the epoxy resin is required to be partially cured so as to become tack-free when a sheet is formed therefrom. Such partial curing is difficult to control, and moreover a problem arises on the stability and shelf stability of the resulting sheet.

In addition, the epoxy resins are insufficient in adhesive property and mechanical strength and poor in moisture resistance, dielectric properties and low impurity absorption property, and further offer problems on dielectric properties at a high temperature and changes thereof with time. It is accordingly difficult for the epoxy resins to achieve stability and high reliability at high temperature and high humidity. Further, movable ions in the resins may adversely affect semiconductor parts in some cases.

In recent years, attention has been paid to thermoplastic norbornene resins having a repeating unit derived from a cycloolefin as resin materials excellent in heat resistance, moisture resistance, electric properties and low impurity absorption property. For example, Japanese Patent Application Laid-Open No. 27412/1987 discloses modified cycloolefin copolymers obtained by graft-modifying a cycloolefin copolymer such as an addition polymer of tetracyclododecene and ethylene with allyl glycidyl ether or maleic anhydride. However, it has not been proposed to use such thermoplastic norbornene resins as adhesives in mounting of semiconductor parts.

DISCLOSURE OF THE INVENTION

It is an object of the present invention to provide an adhesive for semiconductor parts, which is excellent in shelf stability, adhesive property, heat resistance, moisture resistance, low water absorption property, dielectric properties, productivity, mechanical properties and long-term reliability.

Another object of the present invention is to provide a process for producing a semiconductor part package, comprising the step of bonding a semiconductor part to a wiring board with such an adhesive excellent in various properties.

A further object of the present invention is to provide a semiconductor package bonded with such an adhesive excellent in various properties.

The present inventors have carried out an extensive investigation with a view toward overcoming the above-described problems involved in the prior art. As a result, it has been found that at least one cyclic structure-containing thermoplastic polymer selected from the group consisting of (a) a cycloolefin polymer and (b) an aromatic-condensed polymer having a repeating unit of an aromatic ring in its main chain, and having a number average molecular weight of 1,000 to 500,000 is used as base polymer, whereby an adhesive for semiconductor parts, which is excellent in the above-described various properties, can be obtained.

The cyclic structure-containing thermoplastic polymer useful in the practice of the present invention desirably has a functional group, particularly a polar group in order to improve its adhesion to metals, other resins and the like.

The adhesive according to the present invention is generally used in the form of an adhesive solution or adhesive film (including a sheet). A filler may be contained in the adhesive according to the present invention, thereby controlling the coefficient of linear expansion thereof within a desired range, and moreover enhancing the strength of a film formed from such an adhesive, and consequently also enhancing the adhesive strength. The adhesive according to the present invention can also be provided as an anisotropic conductive material by containing a conductive filler therein. Further, a low-molecular weight component such as an epoxy resin or petroleum resin may be contained in the adhesive according to the present invention, thereby controlling the viscosity thereof within a desired range and moreover enhancing the adhesive property to semiconductor parts and boards (substrates) having fine irregularities. The adhesive according to the present invention can satisfy evaluation criteria according to a temperature cycle test and a high-temperature and high-humidity test.

The adhesive according to the present invention is an adhesive comprising a.cyclic structure-containing thermoplastic polymer as a base polymer and has excellent repairability because no hardener is used. Besides, the adhesive according to the present invention is excellent in shelf stability because no hardener is used, and in productivity because the time required for curing is unnecessary. More specifically, the adhesive according to the present invention can be bonded by heating and melting it to and then cooling it, or applying an organic solvent solution thereof and then drying it.

According to the present invention, there is thus provided an adhesive for semiconductor parts, comprising, as a base polymer, at least one cyclic structure-containing thermoplastic polymer selected from the group consisting of (a) a cycloolefin polymer and (b) an aromatic-condensed polymer having a repeating unit of an aromatic ring in its main chain, and having a number average molecular weight of 1,000 to 500,000.

According to the present invention, there is also provided an adhesive film for semiconductor parts, which is obtained by forming a film from the above-described adhesive.

According to the present invention, there is further provided a semiconductor part package obtained by bonding a semiconductor part to a substrate with a solution or film of the above-described adhesive.

According to the present invention, there is still further provided a process for producing a semiconductor part package, which comprises laminating the above-described adhesive film on the surface of a substrate, placing a semiconductor part on the adhesive film, bonding the semiconductor part to the substrate by heating and pressurizing the adhesive film at a temperature not lower than the glass transition temperature of the cyclic structure-containing thermoplastic polymer, and then cooling the adhesive film.

According to the present invention, there is yet still further provided a process for producing a semiconductor part package, which comprises applying a solution of the above-described adhesive to the surface of a substrate, drying a solvent to form an adhesive layer, placing a semiconductor part on the adhesive layer, bonding the semiconductor part to the substrate by heating and pressurizing the adhesive layer at a temperature not lower than the glass transition temperature of the cyclic structure-containing thermoplastic polymer. and then cooling the adhesive layer.

Figure 1:
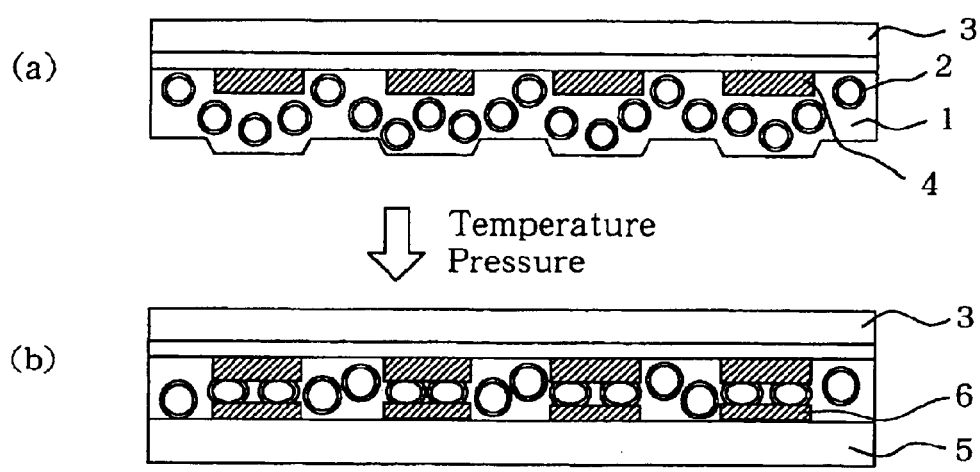
FIG. 1 is a schematic cross-sectional view illustrating a system of Joining and adhesive-bonding a tape carrier package (TCP), in which a semiconductor chip has been incorporated, to a liquid crystal display panel through an anisotropic conductive film.

BEST MODE FOR CARRYING OUT THE INVENTION (Adhesive for Semiconductor Parts)

The adhesive for semiconductor parts used in the present invention is an adhesive comprising, as a base polymer, a cyclic structure-containing thermoplastic polymer composed of a cycloolefin polymer containing a repeating unit derived from a cycloolefin and/or an aromatic-condensed polymer having a repeating unit of an aromatic ring in its main chain, and having a number average molecular weight of 1,000 to 500,000.

[Cycloolefin Polymer]

The cycloolefin polymer useful in the practice of the present invention is a polymer containing a repeating unit derived from a cycloolefln monomer in the whole repeating unit of the polymer. Examples of the cycloolefin monomer include alicyclic monomers having a norbornene ring, monocyclic cycloolefin and cyclic conjugated dienes. These cycloolefin monomers may be used either singly or in any combination thereof, and may be copolymerized with another copolymerizable monomer. The repeating unit derived from the cycloolefin monomer includes not only the repeating unit of the cycloolefin, but also modified units of this repeating unit. Modifications include hydrogenation and graft modification by a polar group-containing unsaturated compound.

No particular limitation is imposed on the bonding style of the cycloolefin monomer so far as a cyclic structure can be introduced in a main chain, and it may be either addition polymerization or ring-opening polymerization. Examples of the cycloolefin polymer include:

(1) addition polymers obtained by addition-polymerizing a carbon-carbon unsaturated bond in an alicyclic monomer having a norbornene ring, such as norbornene, ethylidene-norbornene, dicyclopentadiene or tetracyclododecene;

(2) addition copolymers obtained by addition-copolymerizing an alicyclic monomer having a norbornene ring and an unsaturated monomer such as an α-olefin;

(3) addition polymers obtained by addition-polymerizing a carbon-carbon unsaturated bond in a monocyclic cycloolefin such as cyclopentene or cyclohexene;

(4) addition polymers obtained by subjecting a cyclic conjugated diene such as cyclohexadiene to 1,4-addition polymerization;

(5) ring-opening polymers obtained by ring-opening polymerization of an alicyclic monomer having a norbornene ring; and (6) hydrogenated products thereof.

The cycloolefin polymer used in the present invention is preferably good in mechanical properties, electrical properties and low water absorption property and excellent in heat resistance. A thermoplastic norbornene resin, particularly, a thermoplastic saturated norbornene resin such as an addition (co)polymer comprising an alicyclic monomer (i.e., norbornene monomer) having a norbornene ring as a main component, or a hydrogenated product of a ring-opening polymer of the norbornene monomer is preferred as the cycloolefin polymer in that it is excellent in these various properties. Besides, a hydrogenated product of a 1,4-addition type polymer of a cyclic conjugated diene such as 1,3-cyclohexadiene is also preferred in that it is excellent in various properties such as heat resistance.

The proportion of the repeating unit derived from the cycloolefin monomer in the cycloolefin polymer can be suitably determined according to the kind of a comonomer used and desired physical properties. However, it is desirable from the viewpoints of mechanical properties, electrical properties, low water absorption property, heat resistance, etc. that the proportion be generally at least 30 mol % based on the whole repeating unit of the polymer. In the case of, for example, an addition polymer of a norbornene monomer and ethylene, the copolymer can be provided as a copolymer having preferred various properties when the proportion of the norbornene monomer is at least 30 mol %, preferably at least 35 mol %. When high heat resistance is required, the proportion of the repeating unit derived from the cycloolefin monomer in the cycloolefin polymer is preferably at least 50 mol %, more preferably at least 70 mol %, most preferably at least 80 mol %. The upper limit thereof is 100 mol %.

The cycloolefin polymer is desirably a polymer having a glass transition temperature (Tg) of generally at least 100° C., preferably at least 110° C., more preferably at least 120° C. as measured by a differential scanning calorimeter (DSC). When higher heat resistance is required, it is desirable that the Tg of the cycloolefin polymer be generally at least 130° C., preferably at least 140° C., more preferably at least 150° C. When still higher heat resistance is required, the cycloolefin polymer can be provided as a polymer having a Tg of at least 200° C. by adjusting the kind of monomer(s) used, polymerization process, molecular weight, modifying method, etc. The upper limit of Tg is generally about 300° C. When the Tg of the cycloolefin polymer is high, an adhesive layer excellent in heat resistance can be formed when the polymer is used in an adhesive to bond a semiconductor part to a substrate, so that the reliability of the resulting semiconductor part package is enhanced to a great extent. If the Tg is too high, bonding at a low temperature becomes difficult. When the glass transition temperature of the cycloolefin polymer falls within the above range, bonding at a temperature lower than before within a temperature range upon mounting a semiconductor part package with the resulting adhesive is allowed, and the heat resistance of the adhesive becomes excellent. The glass transition temperature within the above range is hence preferred.

The molecular weight of the cycloolefin polymer used in the present invention is within a range of 1,000 to 500,000, preferably 3,000 to 300,000, more preferably 5,000 to 250,000 when expressed by a number average molecular weight (Mn) in terms of polystyrene as measured by gel permeation chromatography (GPC). The molecular weight is often within a range of 10,000 to 200,000.

If the number average molecular weight of the cycloolefin polymer is extremely low, the strength of an adhesive layer formed from the resulting adhesive is lowered, which forms the cause of cracking or the like. If the number average molecular weight is extremely high on the other hand, the viscosity of the polymer becomes too high, and so its film-forming property and the like are deteriorated. It is hence not preferable to use a polymer having such a too low or high molecular weight. When the number average molecular weight falls within the above range, the strength of the adhesive layer, and the viscosity and processability of the polymer are moderately balanced with each other, and so such a polymer is preferred.

The cycloolefin polymer preferably contains a functional group (particularly, polar group) for the purpose of, for example, enhancing the adhesive property to metal wiring and the like. Methods for containing the functional group in the cycloolefin polymer include a method of modifying the cycloolefin polymer and a method of (co)polymerizing a cycloolefin monomer having a functional group.

[Cycloolefin Monomer]

No particular limitation is imposed on the cycloolefin monomer used as a component of the cycloolefin polymer so far as it is a cyclic hydrocarbon compound having a carbon-carbon unsaturated bond. However, the principal monomers include (1) alicyclic monomers (norbornene monomers) having a norbornene ring, (2) monocyclic cycloolefin monomers and (3) cyclic conjugated diene monomers.

(1) Alicyclic Monomer Having a Norbornene Ring

The alicyclic monomers having a norbornene ring are alicyclic monomers having a norbornene ring described in Japanese Patent Application Laid-Open Nos. 320268/1993 and 36224/1990. These alicyclic monomers having a norbornene ring may be used either singly or in any combination thereof.

Examples of the alicyclic monomer having a norbornene ring include (i) monomers having no other unsaturated bond than a carbon-carbon unsaturated bond participating in a polymerization reaction, such as norbornene, tetracyclododecene and alkyl-substituted products thereof, (ii) monomers having another unsaturated bond in addition to a carbon-carbon unsaturated bond participating in a polymerization reaction, such as ethylidenenorbornene, vinylnorbornene, ethylidene-tetracyclododecene and dicyclopentadiene, (iii) monomers having an aromatic ring, such as dimethano-tetrahydrofluorene and phenylnorbornene, and (iv) monomers having a polar group, such as methoxycarbonylnorbornene and methoxycarbonyltetracyclododecene. Such monomers will hereinafter be described in more detail.

(i) Specific examples of the monomer having no other unsaturated bond than a carbon-carbon unsaturated bond participating in a polymerization reaction include bicyclo[2.2.1]hept-2-ene derivatives (norbornenes) such as bicyclo[2.2.1]hept-2-ene, 5-methylbicyclo[2.2.1]hept-2-ene, 5-ethylbicyclo[2.2.1]hept-2-ene, 5-butylbicyclo[2.2.1]hept-2-ene, 5-hexylbicyclo[2.2.1]hept-2-ene and 5-decylbicyclo[2.2.1]hept-2-ene; tetracyclo[4.4.1$^{2,5}$.1$^{7,10}$.0]-dodec-3-ene derivatives (tetracyclododecenes) such as tetracyclo[4.4.1$^{2,5}$. 1$^{7,10}$.0]-dodec-3-ene, 8-methyltetracyclo-[4.4.1$^{2,5}$. 1$^{7,10}$.0]-dodec-3-ene and 8-ethyltetracyclo-[4.4.1$^{2,5}$.1$^{7,10}$.0]-dodec-3-ene; tricyclo[4.3.1$^{2,5}$.0]-dec-3-ene; and bicyclo[2.2.1]hept-2-ene derivatives having a cyclic substituent group, such as 5-cyclohexylbicyclo[2.2.1]hept-2-ene and 5-cyclopentyl-bicyclo[2.2.1]hept-2-ene.

(ii) Specific examples of the monomer having another unsaturated bond in addition to a carbon-carbon unsaturated bond participating in a polymerization reaction include bicyclo[2.2.1]hept-2-ene derivatives having an unsaturated bond outside its ring, such as 5-ethylidenebicyclo[2.2.1]hept-2-ene, 5-vinylbicyclo[2.2.1]hept-2-ene and 5-propenylbicyclo[2.2.1]hept-2-ene; tetracyclo[4.4.1$^{2,5}$. 1$^{7,10}$.0]-dodec-3-ene derivatives having an unsaturated bond outside its ring, such as 8-methylidenetetracyclo[4.4.1$^{2,5}$. 1$^{7,10}$.0]-dodec-3-ene, 8-ethylidenetetracyclo[4.4.1$^{2,5}$.1$^{7,10}$. 0]-dodec-3-ene, 8-vinyl-tetracyclo[4.4.1$^{2,5}$.1$^{7,10}$.0]-dodec-3-ene and 8-propenyl-tetracyclo[4.4.1$^{2,5}$.1$^{7,10}$.0]-dodec-3-ene; tricyclo[4.3.1$^{2,5}$.0]-dec-3,7-diene; and bicyclo[2.2.1]hept-2-ene derivatives having a cyclic substituent group with an unsaturated bond, such as 5-cyclohexenylbicyclo[2.2.1]hept-2-ene and 5-cyclopentenylbicyclo[2.2.1]hept-2-ene.

(iii) Specific examples of the monomer having an aromatic ring include 5-phenylbicyclo[2.2.1]hept-2-ene, tetracyclo[6.5.1$^{2,5}$.0$^{1,6}$.0$^{8,13}$]tridec-3,8,10,12-tetraene (also referred to as 1,4-methano-1,4,4a,9a-tetrahydrofluorene) and tetracyclo[6.6.1$^{2,5}$.0$^{1,6}$.0$^{8,13}$]tetradec-3,8,10,12-tetraene (also referred to as 1,4-methano-1,4,4a,5,10,10a-hexahydroanthracene).

(iv) Specific examples of the monomer having a polar group (functional group) include bicyclo[2.2.1]hept-2-ene derivatives having at least one substituent group containing an oxygen atom, such as 5-methoxycarbonylbicyclo[2.2.1]hept-2-ene, 5-ethoxycarbonylbicyclo[2.2.1]hept-2-ene, 5-methyl-5-methoxycarbonylbicyclo[2.2.1]hept-2-ene, 5-methyl-5-ethoxycarbonylbicyclo[2.2.1]hept-2-ene, bicyclo[2.2.1]hept-5-enyl-2-methylpropionate, bicyclo[2.2.1]hept-5-enyl-2-methyloctanoate, bicyclo[2.2.1]hept-2-ene-5,6-dicarboxylic acid anhydride, 5-hydroxymethylbicyclo[2.2.1]hept-2-ene, 5,6-di(hydroxymethyl)bicyclo[2.2.1]hept-2-ene, 5-hydroxyisopropylbicyclo[2.2.1]hept-2-ene and 5,6-dicarboxybicyclo[2.2.1]hept-2-ene; tetracyclo[4.4.1$^{2,5}$. 1$^{7,10}$.0]-dodec-3-ene derivatives having at least one substituent group containing an oxygen atom, such as 8-methoxycarbonyltetracyclo[4.4.1$^{2,5}$.1$^{7,10}$.0]-dodec-3-ene, 8-methyl-8-methoxycarbonyltetracyclo [4.4.1$^{2,5}$.1$^{7,10}$.0]-dodec-3-ene, 8-hydroxymethyltetracyclo[4.4.1$^{2,5}$.1$^{7,10}$.0]-dodec-3-ene and 8-carboxytetracyclo[4.4.1$^{2,5}$.1$^{7,10}$.0]-dodec-3-ene; and bicyclo[2.2.1]hept-2-ene derivatives having at least one substituent group containing a nitrogen atom, such as 5-cyanobicyclo[2.2.1]hept-2-ene and bicyclo[2.2.1]hept-2-ene-5,6-dicarboxylic acid imide.

Further, alicyclic monomers having a norbornene ring with an alkyl substituent group having at least 4 carbon atoms may be mentioned in common to all the alicyclic monomers having a norbornene ring. In the other hand, these monomers having a norbornene ring may be used either singly or in any combination thereof.

(2) Monocyclic Cycloolefin Monomer

The monocyclic cycloolefin monomers are cyclic compounds having a carbon-carbon double bond in their rings. Specific examples thereof include cyclobutene, cyclopentene, cyclohexene, cycloheptene and cyclooctene (Japanese Patent Application Laid-Open No. 66216/1989).

These monocyclic cycloolefin monomers may be used either singly or in any combination thereof.

(3) Cyclic Conjugated Diene Monomer

The cyclic conjugated diene monomers are cyclic compounds having a conjugated carbon-carbon double bond in their rings. Specific examples thereof include 1,3-cyclopentadiene, 1,3-cyclohexadiene, 1,3-cycloheptadiene and 1,3-cyclooctadiene (Japanese Patent Application Laid-Open No. 258318/1995). These cyclic conjugated diene monomers are cyclic compounds may be used either singly or in any combination thereof.

As unsaturated monomers copolymerizable with the cycloolefin monomer, may be mentioned α-olefins having 2 to 12 carbon atoms, such as ethylene, propylene, 1-butene and 4-methyl-1-pentene; styrene and derivatives thereof such as styrene, α-methylstyrene, p-methylstyrene and p-chlorostyrene; linear conjugated dienes such as 1,3-butadiene and isoprene; vinyl ethers such as ethyl vinyl ether and isobutyl vinyl ether; and carbon monoxide. Such unsaturated monomers are not particularly limited to the above monomers so far as they are copolymerizable with the cycloolefin monomer. In the case where the alicyclic monomer having a norbornene ring is copolymerized with another unsaturated monomer, a vinyl compound such as one of the above-mentioned α-olefins is preferably used as said another unsaturated monomer, and a ethylene is especially preferable.

[Aromatic-condensed Polymer]

The aromatic-condensed polymer useful in the practice of the present invention is a polymer having a repeating unit of an aromatic ring in its main chain, in which aromatic rings are bonded to each other by a unit structure containing a heteroatom. No particular limitation is imposed on the heteroatom. However, examples thereof include oxygen and sulfur. Examples of the bonding style include an ether linkage and an ester linkage. Specific examples of the aromatic-condensed polymer include aromatic polyether type polymers such as poly(phenylene sulfide), poly(phenylene ether), poly(ether sulfone) and polysulfone; and aromatic polyesters such as liquid crystalline plastics, aromatic polyester, polyarylate, polyethylene terephthalate, polybutylene terephthalate, polycarbonate, poly(ether ether ketone) and poly(ether ketone).

Of these, the aromatic polyether type polymers such as poly(phenylene sulfide) and poly(phenylene ether), which are constituted by a simple ether linkage composed of aromatic rings and a heteroatom, are preferred from the viewpoint of heat resistance, low moisture absorption property, dielectric properties, etc. Of the aromatic polyester type polymers, polymers having a high aromatic ring content per unit structure, such as liquid crystalline plastics, are preferred. In particular, the above-described 3 polymers are preferred, with poly(phenylene ether) (PPE) being most preferred.

The molecular weight of the aromatic-condensed polymer is within a range of 1,000 to 500,000, preferably 3,000 to 300,000, more preferably 5,000 to 250,000 when expressed by a number average molecular weight (Mn) in terms of polystyrene as measured by GPC. When the number average molecular weight of an aromatic-condensed polymer cannot be determined by GPC, its melt viscosity or the like may be used as an index to the molecular weight.

The Tg of the aromatic-condensed polymer is 100 to 300° C., preferably 120 to 250° C., more preferably 140 to 200° C. as measured by DSC. When the glass transition temperature of the aromatic-condensed polymer falls within the above range, bonding at a temperature lower than before within a temperature range upon mounting a semiconductor part package with the resulting adhesive is allowed, and the heat resistance of the adhesive becomes excellent. The glass transition temperature within the above range is hence preferred.

[Functional Group-containing Cycloolefin Polymer]

The cyclic structure-containing thermoplastic polymer used in the present invention preferably contains a functional group (polar group) for the purpose of, for example, enhancing the adhesive property to metals, improving compatibility with other compounding additives, resins and the like, and enhancing heat resistance.

No particular limitation is imposed on the functional group in the functional group-containing cycloolefin polymer used in the present invention so far as it is a functional group which is capable of enhancing the adhesive property to metals (particularly, semiconductor chips and electrodes) and wiring boards (insulating resins, metal wiring and electrodes). Examples thereof include epoxy, carboxyl, hydroxyl, ester, silanol, silyl, amino, nitrile, halogeno, acyl and sulfone groups. Of these functional groups, polar groups such as an epoxy group, acid anhydride groups, ring-opening groups of acid anhydride groups, a carboxyl group, a hydroxyl group and a silanol group are preferred for reasons of, for example, making it possible to improve adhesive property at a low modification rate.

The cyclic structure-containing thermoplastic polymer having a functional group can be obtained by introducing a functional group into the cyclic structure-containing thermoplastic polymer, for example, in accordance with one of the following three processes:

(1) a process in which a functional group-containing unsaturated compound is added to the polymer by a graft reaction, (2) a process in which a functional group is directly introduced into a carbon-carbon unsaturated bond in the polymer, and (3) a process in which a functional group-containing monomer is copolymerized upon polymerization of a polymer.

The respective processes for introducing a functional group will hereinafter be described in detail.

(1) Graft Reaction of Functional Group-containing Unsaturated Compound

The cyclic structure-containing thermoplastic polymer having a functional group can be obtained by reacting the cyclic structure-containing thermoplastic polymer with a functional group-containing unsaturated compound in the presence of an organic peroxide. No particular limitation is imposed on the functional group-containing unsaturated compound. However, epoxy group-containing unsaturated compounds, carboxyl group-containing unsaturated compounds, hydroxyl group-containing unsaturated compounds, silyl group-containing unsaturated compounds, etc. are preferred because adhesive property can be improved in a small amount.

Examples of the epoxy group-containing unsaturated compounds include glycidyl esters such as glycidyl acrylate, glycidyl methacrylate and glycidyl p-styryl-carboxylate; mono- or polyglycidyl esters of unsaturated polycarboxylic acids such as endo-cis-bicyclo[2,2,1]hept-5-ene-2,3-dicarboxylic acid and endo-cis-bicyclo[2,2,1]hept-5-ene-2-methyl-2,3-dicarboxylic acid; unsaturated glycidyl ethers such as allyl glycidyl ether, 2-methyl-allyl glycidyl ether, glycidyl ether of o-allylphenol, glycidyl ether of m-allylphenol and glycidyl ether of p-allylphenol; and 2-(o-vinylphenyl)ethylene oxide, 2-(p-vinylphenyl)ethylene oxide, 2-(o-allylphenyl)ethylene oxide, 2-(p-allylphenyl) ethylene oxide, 2-(o-vinylphenyl)propylene oxide, 2-(p-vinylphenyl)propylene oxide, 2-(o-allylphenyl)propylene oxide, 2-(p-allylphenyl)propylene oxide, p-glycidylstyrene, 3,4-epoxy-1-butene, 3,4-epoxy-3-methyl-1-butene, 3,4-epoxy-1-pentene, 3,4-epoxy-3-methyl-1-pentene, 5,6-epoxy-1-hexene, vinylcyclohexene monoxide and allyl-2,3-epoxycyclopentyl ether. Of these, the allyl glycidyl esters and allyl glycidyl ethers are preferred, with the allyl glycidyl ethers being particularly preferred, in that such an epoxy group-containing unsaturated compound permits graft addition at a particularly high reaction rate. These epoxy group-containing unsaturated compounds may be used either singly or in any combination thereof.

As examples of the carboxyl group-containing unsaturated compounds, may be mentioned compounds described in Japanese Patent Application Laid-Open No. 271356/1993, for example, unsaturated carboxylic acids such as acrylic acid, methacrylic acid and α-ethylacrylic acid; and unsaturated dicarboxylic acid such as maleic acid, fumaric acid, itaconic acid, endo-cis-bicyclo[2.2.1]hept-5-ene-2,3-dicarboxylic acid and methyl-endo-cis-bicyclo[2.2.1]hept-5-ene-2,3-dicarboxylic acid. Derivatives of the unsaturated carboxylic acids may also be included in the carboxyl group-containing unsaturated compounds. As examples of the unsaturated carboxylic acid derivatives, may be mentioned anhydrides, esters, halides, amides and imides of unsaturated carboxylic acids, and specific examples thereof include acid anhydrides such as maleic anhydride, chloromaleic anhydride, butenylsuccinic anhydride, tetrahydrophthalic anhydride and citraconlc anhydride: esters such as monomethyl maleate, dimethyl maleate and glycidyl maleate; and malenyl chloride and maleimide. Of these, acid anhydrides such as maleic anhydride and itaconic anhydride are particularly preferred for the above-described reasons.

Examples of the hydroxyl group-containing unsaturated compounds include allyl alcohol, 2-allyl-6-methoxyphenol, 4-allyloxy-2-hydroxybenzophenone, 3-allyloxy-1,2-propanediol, 2-allyldiphenol, 3-buten-1-ol, 4-penten-1-ol and 5-hexen-1-ol.

Examples of the silyl group-containing unsaturated compounds include chlorodimethylvinylsilane, trimethylsilylacetylene, 5-trimethylsilyl-1,3-cyclopentadiene, 3-trimethylsilylallyl alcohol, trimethylsilyl methacrylate, 1-trimethylsilyloxy-1,3-butadiene, 1-trimethylsilyloxycyclopentene, 2-trimethylsilyloxyethyl methacrylate, 2-trimethylsilyloxyfuran, 2-trimethyl-silyloxypropene, allyloxy-t-butyldimethylsilane and allyloxytrimethylsilane.

As the unsaturated organosilicon compounds are preferred trisalkoxyvinylsilanes such as trimethoxyvinylsilane, triethoxyvinylsilane and tris(methoxyethoxy)vinylsilane. The alkoxy groups in such an unsaturated organosllicon compounds can be hydrolyzed into silanol groups.

No particular limitation is imposed on the organic peroxide, and any peroxide may be used so far as it is a compound used heretofore in graft reactions of unsaturated compounds. As specific examples of the organic peroxide, organic peroxides, organic peresters, etc. may be preferably used. As specific examples of such an organic peroxide, may be mentioned benzoyl peroxide, dichlorobenzoyl peroxide, dicumyl peroxide, di-tert-butyl peroxide, 2,5-dimethyl-2,5-di(peroxide benzoate)hexyne-3,1,4-bis(tert-butyl peroxylsopropyl)benzene, lauroyl peroxide, tert-butyl peracetate, 2,5-dimethyl-2,5-di(tert-butyl peroxy)hexyne-3, 2,5-dimethyl-2,5-di(tert-butyl peroxy)hexane, tert-butyl perbenzoate, tert-butyl perphenylacetate, tert-butyl perisobutyrate, tert-butyl per-sec-octoate, tert-butyl perpivalate, cumyl perpivalate and tert-butyl perdiethylacetate.

In the present invention, azo compounds may also be used as the organic peroxides. As specific examples of the azo compounds, may be mentioned azobisisobutyronitrile and dimethyl azoisobutyrate.

Of these, benzoyl peroxide, and dialkyl peroxides such as dicumyl peroxide, di-tert-butyl peroxide. 2,5-dimethyl-2,5-di(tert-butyl peroxide)hexyne-3,2,5-dimethyl-2,5-di(tert-butyl peroxy)hexane and 1,4-bis(tert-butyl peroxyisopropyl)benzene are preferably used as the organic peroxides.

These organic peroxides may be used either singly or in any combination thereof. The proportion of the organic peroxide used is within a range of generally 0.001 to 30 parts by weight, preferably 0.01 to 20 parts by weight, more preferably 0.1 to 10 parts by weight per 100 parts by weight of the unmodified cyclic structure-containing thermoplastic polymer in terms of a charged proportion upon the reaction. Any amount of the organic peroxide used within this range is preferred because the reaction rate of the functional group-containing unsaturated compound, and various properties of the resulting modified polymer, such as water absorptivity and dielectric properties are balanced with one another at a high level.

No particular limitation is imposed on the graft-modifying reaction, and the reaction may be carried out in accordance with a method known per se in the art. The reaction is conducted at a temperature of generally 0 to 400° C., preferably 60 to 350° C. The reaction time is generally within a range of 1 minute to 24 hours, preferably 30 minutes to 10 hours. After completion of the reaction, a poor solvent such as methanol is added in a great amount to the reaction system to deposit a polymer formed, and the polymer is collected by filtration, washed and then dried under reduced pressure, whereby a graft-modified polymer can be obtained.

(2) Direct Modification of Carbon-carbon Unsaturated Bond

In the case where an olefinic carbon-carbon unsaturated bond is contained in the cyclic structure-containing thermoplastic polymer, the cyclic structure-containing thermoplastic polymer containing a functional group can be obtained by introducing a functional group by modifying the unsaturated bond to add the functional group or by bonding a compound having a functional group to the unsaturated bond.

With respect to a process for introducing the functional group, such a process as described in Japanese Patent Application Laid-Open No. 172423/1994 may be used. Specifically, a process in which an epoxy group, carboxyl group, hydroxyl group or the like is introduced by a method of oxidizing the olefinic unsaturated bond, a method of adding a compound having at least one functional group in its molecule to the olefinic unsaturated bond, or the like is mentioned.

(3) Copolymerization of Functional Group-containing Monomer

No particular limitation is imposed on the functional group-containing monomer. However, as examples of the monomer having a functional group, may be mentioned the monomers having a polar group mentioned in (iv) in the above description as to the monomers. Of these monomers, monomers having a hydroxyl, carboxyl or ester group, such as 5-hydroxymethylbicyclo[2.2.1]hept-2-ene, 5-hydroxyisopropylbicyclo[2.2.1]hept-2-ene, 5-methoxycarbonylbicyclo[2.2.1]hept-2-ene, 8-methoxycarbonyltetracyclo[4.4.0.1$^{2,5}$.1$^{7,10}$]-dodec-3-ene and 5,6-dicarboxybicyclo[2.2.1]hept-2-ene are preferred from the viewpoint of easy copolymerization. With respect to a catalyst and a polymerization process, a polymerization catalyst and a polymerization process for the alicyclic monomer having a norbornene ring may be used.

Of the above polar group-introducing processes, the graft-modifying process is preferred for reasons of being able to perform the modification under easy reaction conditions and being able to easily introduce a polar group at a high modification rate. As the polar group-containing unsaturated compound used in the graft reaction, an unsaturated compound having a dicarboxylic acid anhydride group having a carbon-carbon unsaturated bond in its molecule, such as an epoxy, maleic anhydride or itaconic anhydride group is particularly preferred for the above-described reasons.

(4) Rate of Introduction of Functional Group

The rate (modification rate) of introduction of the functional group in the functional group-containing cyclic structure-containing thermoplastic polymer is suitably selected as necessary for the end application intended. However, it is within a range of generally 0.1 to 100 mol %, preferably 0.5 to 70 mol %, more preferably 1 to 50 mol % based on the total number of monomer units in the polymer. It is preferred that the rate of introduction of the functional group should fall within this range, since the adhesive strength to metals, heat resistance, mechanical strength, water absorptivity and dielectric properties are balanced with one another at a high level. The functional group is preferably a polar group as described above.

The rate of introduction of the functional group (modification rate: mol %) is represented by the following equation (1):

$$\text{Rate of introduction of functional group} = (X/Y) \times 100 \quad (1)$$

wherein

X: (a) the total number of moles of modifying residue introduced by a graft monomer,
  (b) (the total number of moles of unsaturated bond-containing monomer)×(rate of addition of functional group to unsaturated bond), or
  (c) the total number of moles of the functional group-containing monomer
  (all, determined by $^1$H-NMR);

Y: the total number of monomer units in the polymer (weight average molecular weight of the polymer/average molecular weight of the monomer).

(Adhesive Resin Composition)

The adhesive according to the present invention is an adhesive comprising the cyclic structure-containing thermoplastic polymer as a base polymer and is desirably a resin composition containing a filler.

[Filler]

The filler is blended for the purpose of (1) making the coefficient value of linear expansion of the adhesive close to those of semiconductor parts and substrates to reduce shear stress, (2) electrically connecting electrode bumps of a semiconductor part to an electrode of a substrate and (3) enhancing the adhesive strength (cohesive failure strength) of the adhesive to semiconductor parts and substrates.

No particular limitation is imposed on the kind of the filler used so far as it satisfies the above requirements. More specifically, the various kinds of fillers used heretofore in resin sealing materials for semiconductor parts may be used for the purposes of (1) and (3). Of these fillers, inorganic fillers are preferred as filler having a low coefficient of linear expansion, with fused silica (the same meaning as amorphous silica or quartz glass) having a particularly low coefficient of linear expansion being particularly preferred. Conductive particles (conductive fillers) used heretofore in anisotropic conductive films may be mentioned for the purpose of (2).

(1) Filler (Non-conductive Filler, Particularly Inorganic Filler)

No particular limitation is imposed on non-conductive fillers, and there may be used, for example, those used heretofore in epoxy resin adhesives and sealing materials. Specific examples of the fillers include silica, diatomaceous earth, alumina, titanium oxide, magnesium oxide, pumice powder, pumice balloon, basic magnesium carbonate, dolomite, calcium sulfate, potassium titanate, barium sulfate, calcium sulfite, talc, clay, mica. asbestos, glass fibers, glass flake, glass beads, calcium silicate, montmorillonite, bentonite, graphite, aluminum powder, molybdenum sulfide, boron fibers, silicon carbide fibers, polyethylene fibers, polypropylene fibers, polyester fibers and polyamide fibers. Of these fillers, inorganic fillers are preferred for reasons of becoming excellent in heat resistance, low water absorptivity, dielectric properties, low impurity absorption property, etc. in particular, with silica being particularly preferred.

The non-conductive filler (particularly, inorganic filler) is generally used in a proportion of 1 to 100 parts by weight, preferably 5 to 70 parts by weight, more preferably 10 to 50 parts by weight per 100 parts by weight of the cyclic structure-containing thermoplastic polymer. The blending the filler has the following effects. Namely, the coefficient of linear expansion of the resulting adhesive can be controlled within a desired range, and moreover the strength (film strength) of an adhesive layer formed from such an adhesive can be enhanced, and consequently the adhesive strength can also be enhanced. If the blending proportion of the filler is too low, the effect brought about by the addition becomes little. If the proportion is too high on the other hand, the adhesive force of the resulting adhesive is lowered. However, the filler may be contained in an amount greater than the upper limit of the above range when the adhesive is applied to uses of which high adhesive strength is not required, thereby improving the thermal conductivity and the like thereof.

(2) Conductive Particles (Conductive Filler)

No particular limitation is imposed on the kind of conductive particles, and they are suitably selected according to the kinds of the base polymer and substances to be bonded. Specific examples thereof include conductive fillers described in "Society of Industrial Research: Elementary Course of Electronics Mounting Techniques, Vol. 4, Mounting and Assembling Techniques, Chapter 6".

Examples of the conductive particles include ① particles of metals such as nickel, aluminum, silver, copper, tin, lead, gold, zinc, platinum, cobalt and alloys thereof (for example, solder), ② aggregated metal particles, ③ fused metal particles, ④ conductive carbon particles such as conductive carbon black and carbon single fibers, ⑤ particles of styrene, phenol and epoxy resins and metal-coated resin particles obtained by subjecting composite particles of these resin particles and a solder or the like to a metal plating treatment with Ni, Au or the like, ⑥ composite resin particles combined by dispersing metal particles in a flexible resin such as a polyurethane resin, and ⑦ microcapsulated conductive particles.

The microcapsulated conductive particles comprise conductive particles and an insulating resin layer formed on the surfaces of the conductive particles, and examples thereof may include (i) metal particles such as nickel, aluminum, silver, copper, tin, lead, gold, zinc, platinum, cobalt and alloys thereof (for example, solder). the surfaces of which have been coated with an insulating resin, (ii) metal-coated resin particles obtained by subjecting resin particles to a metal plating treatment with Ni, Au or the like, the surfaces of which have been coated with an insulating resin, and (iii) composite resin particles composed of a resin and metal particles, the surfaces of which have been coated with an insulating resin. No particular limitation is imposed on the production process of the microcapsulated conductive filler, and any publicly known process may be used. Specific examples thereof include a process comprising providing a conductive intermediate layer on a resin as a spherical core material, and coating the surface thereof with an insulating thermoplastic resin, a process comprising coating the surfaces of spherical conductive fine particles with an insulating thermoplastic resin, a process comprising forming an insulating film of a thermoplastic resin or thermosetting resin on the surfaces of conductive particles by plasma polymerization or plasma CVD polymerization, and a process comprising in-situ polymerizing a monomer on the surfaces of conductive fine particles to form a polymer, thereby coating the surfaces of the fine particles. Examples of the insulating resin include thermoplastic resins such as acrylic resins, styrene resins, acrylic/styrene resins, polyamide resins and polyurethane resins; and thermosetting resins such as epoxy/amine type curing substances, maleimide/amine type curing substances and divinylbenzene polymers. These insulating resins preferably have heat resistance bearable to the temperature for heating and pressure-bonding a chip and a substrate. The thickness of a coating layer formed of the insulating resin is preferably at most 3 $\mu$m. The lower limit of the film thickness of the insulating resin layer is generally about 0.05 $\mu$m though it varies according to a production process.

No particular limitation is imposed on the form of the conductive particles. However, it is preferred that the form be spherical, particulate or flat in that a face contact effect among particles can be fully achieved. The average particle diameter of the conductive filler used in the present invention may be suitably selected as necessary for the end application intended and is generally within a range of 0.1 to 30 $\mu$m. preferably 1 to 20 $\mu$m. more preferably 5 to 15 $\mu$m in terms of the average particle diameter of (length+ breadth)/2.

These conductive particles are preferably those uniformly dispersible in the cyclic structure-containing thermoplastic polymer as a base polymer and excellent in adhesion to materials for electrodes. of semiconductor parts and electrodes of substrates.

These conductive particles may be used either singly or in any combination thereof. The blending proportion of the conductive particles is suitably selected as necessary for the end application intended. However, any proportion within a range of generally 1 to 100 parts by weight, preferably 2 to 70 parts by weight, more preferably 3 to 50 parts by weight per 100 parts by weight of the cyclic structure-containing thermoplastic polymer is preferred because the dielectric properties, adhesive property and long-term reliability are balanced with one another at a high level. The blending proportion of the conductive particles is often 5 to 30 parts by weight. If the blending proportion of the conductive particles is too lower, interparticle bonding becomes insufficient, and it is difficult to cope with the formation of a fine-pitch pattern in particular. If the blending proportion of the conductive particles is too high, there is a possibility that the adhesive force of the resulting adhesive may be lowered, or lateral insulating property may be impaired.

A terminal interval is reduced as the miniaturization and high-density packaging of electronic parts make progress, and so there are demands for coping with the formation of a fine-pitch pattern and ensuring high reliability at joints. However, the conventional anisotropic conductive materials cannot sufficiently cope with the formation of a fine-pitch pattern. With the development of the formation of a fine-pitch pattern, for example, the width of a beam lead in a beam lead type semiconductor chip is 50 to 100 $\mu$m, and an interval between beam leads is also about 50 to 100 $\mu$m. When bump bonding is conducted with the conventional anisotropic conductive material on such an electronic part in which a fine-pitch pattern has been formed, it is difficult to ensure insulating property between bumps. On the other hand, the adhesives according to the present invention can meet these demands because the base polymer is excellent in dielectric properties. The use of the microcapsulated conductive particles as conductive particles makes it possible to fill the conductive particles in a high proportion, thereby permitting coping with the formation of fine-pitch electrodes.

FIG. 1 illustrates the bonding mechanism between a semiconductor part and a substrate making use of an anisotropic conductive film. An anisotropic conductive material with a microcapsulated conductive filler 2 dispersed in a resin (adhesive) 1 is used to form an anisotropic conductive film on leads 4 of a TCP 3. This TCP is heated and press-bonded to a side of electrodes 6 of a liquid crystal display panel 5, whereby the microcapsulated conductive filler 2 present between both electrodes is squeezed to electrically connect both electrodes to each other.

[Compounding Additives]

Such compounding additives as described below may be blended into the adhesives according to the present invention.

(1) Flame Retardant

A flame retardant is not an essential component. However, it is preferred that the flame retardant be added to the adhesive, in particular, when LSI chips such as CPU and DRAM are adhesive bonded. No particular limitation is imposed on the flame retardant. However, those which undergo none of decomposition, denaturation and eterioration by a hardener are preferred. Halogen-containing flame retardants are generally used.

Various kinds of chlorine- or bromine-containing flame retardants may be used as the halogen-containing flame retardants. From the viewpoints of flameproofing effect, heat resistance upon forming or molding, dispersibility in resins and influence on the physical properties of the resins, however, the following flame retardants may be preferably used. Namely, preferable examples thereof include hexabromobenzene, pentabromoethylbenzene, hexabromobiphenyl, decabromodiphenyl, hexabromodiphenyl oxide, octabromodiphenyl oxide, decabromodiphenyl oxide, pentabromocyclohexane, tetrabromobisphenol A and derivatives thereof [for example, tetrabromobisphenol A-bis (hydroxyethyl ether), tetrabromobisphenol A-bis(2,3-dibromopropyl ether), tetrabromobisphenol A-bis (bromoethyl ether), tetrabromobisphenol A-bis(allyl ether), etc.], tetrabromobisphenol S and derivative thereof [for example, tetrabromobisphenol S-bis(hydroxyethyl ether), tetrabromobisphenol S-bis(2,3-dibromopropyl ether), etc.], tetrabromophthalic anhydride and derivatives thereof [for example, tetrabromophthalimide, ethylenebistetrabromophthalimide, etc.], ethylenebis(5,6-dibromonorbornene-2,3-dicarboxyimide), tris-(2,3-dibromopropyl-1) isocyanurate, adducts of hexachlorocyclopentadiene by Diels-Alder reaction, tribromophenyl glycidyl ether, tribromophenyl acrylate, ethylenebistribromophenyl ether, ethylenebispentabromophenyl ether, tetradecabromodiphenoxybenzene, brominated polystyrene, brominated polyphenylene oxide, brominated epoxy resins, brominated polycarbonate, polypentabromobenzyl acrylate, octabromonaphthalene, hexabromocyclododecane, bis(tribromophenyl)fumaramide and N-methylhexabromodiphenylamine.

The amount of the flame retardant added is generally 3 to 150 parts by weight, preferably 10 to 140 parts by weight, particularly preferably 15 to 120 parts by weight per 100 parts by weight of the cyclic structure-containing thermoplastic polymer.

As a flame retardant auxiliary for causing the flame retardant to more effectively exhibit its flameproofing effect, for example, an antimonial flame retardant auxiliary such as antimony trioxide, antimony pentoxide, sodium antimonate or antimony trichloride may be used. These flame retardant auxiliaries are used in a proportion of generally 1 to 30 parts by weight, preferably 2 to 20 parts by weight per 100 parts by weight of the flame retardant.

These flame retardants may also be added for playing a role as a plasticizer at the same time when the glass transition temperature (Tg) of the base polymer is particularly high. For example, about 15 parts by weight of a phosphorous flame retardant can be added to 100 parts by weight of a base polymer having a Tg of 300° C. to lower the Tg to about 200° C.

(2) Low-molecular Weight Resin

In the present invention, a low-molecular weight resin may be blended for the purpose of, for example, improving viscosity characteristics upon heating and melting of the base polymer (i.e., cyclic structure-containing thermoplastic polymer) in the adhesive. By blending such a low-molecular weight resin, not only the viscosity characteristics of the adhesive can be improved, but also the adhesive property to surfaces of semiconductor parts and wiring boards having fine irregularities can be enhanced. The blending of such a low-molecular weight resin allows the resulting adhesive to satisfy evaluation criteria according to a temperature cycle test and a high-temperature and high-humidity test.

As examples of the low-molecular weight resins, may be mentioned thermosetting resins such as epoxy resins, polyimide resins (polyamidic acid), bismaleimide-triazine resins, phenol resins and phenol novolak resins; and petroleum resins. Of these, the epoxy resins are preferred. In the present invention, however, these thermosetting resins are used without setting them.

The low-molecular weight resin is used in a proportion of generally 1 to 50 parts by weight, preferably 3 to 40 parts by weight, more preferably 5 to 30 parts by weight per 100 parts by weight of the cyclic structure-containing thermoplastic polymer.

(3) Other Polymer Components

In the present invention, rubbery polymers and other thermoplastic resins may be blended into the adhesives as needed.

The rubbery polymers are polymers having a glass transition temperature of ordinary temperature (25° C.) or lower and include general rubber-like polymers and thermoplastic elastomers. The Mooney viscosity ($ML_{1+4}$, 100° C.) of such a rubbery polymer is suitably selected as necessary for the end application intended and is generally 5 to 200.

Examples of the rubber-like polymers include ethylene-α-olefin type rubbery polymers; ethylene-α-olefin-polyene terpolymer rubbers; copolymers of ethylene and an unsaturated carboxylic acid ester, such as ethylene-methyl methacrylate copolymers and ethylene-butyl acrylate copolymers; copolymers of ethylene and a fatty acid vinyl ester, such as ethylene-vinyl acetate copolymers; polymers of acrylic acid alkyl esters such as ethyl acrylate, butyl acrylate, hexyl acrylate, 2-ethyl-hexyl acrylate and lauryl acrylate; diene rubbers such as polybutadiene, polyisoprene, styrene-butadiene or styrene-isoprene random copolymers, acrylonitrile-butadiene copolymers, butadiene-isoprene copolymers, butadiene-alkyl(meth)acrylate copolymers, butadiene-alkyl(meth)acrylate-acrylonitrile terpolymers and butadiene-alkyl(meth)acrylate-acrylonitrile-styrene tetrapolymers; and butylene-isoprene copolymers.

As examples of the thermoplastic elastomers, may be mentioned aromatic vinyl-conjugated diene block copolymers such as styrene-butadiene block copolymers, hydrogenated styrene-butadiene block copolymers, styrene-isoprene block copolymers and hydrogenated styrene-isoprene block copolymers, low crystalline polybutadiene resins, ethylene-propylene elastomers, styrene-grafted ethylene-propylene elastomers, thermoplastic polyester elastomers, and ethylenic ionomer resins. Of these thermoplastic elastomers, the hydrogenated styrene-butadiene block copolymers and hydrogenated styrene-isoprene block copolymers are preferred. As specific examples thereof, may be mentioned those described in Japanese Patent Application Laid-Open Nos. 133406/1990, 305814/1990, 72512/1991 and 74409/1991, etc.

Examples of the other thermoplastic resins include low density polyethylene, high density polyethylene, linear low density polyethylene, very low density polyethylene, ethylene-ethyl acrylate copolymers, ethylene-vinyl acetate copolymers, polystyrene, poly(phenylene sulfide), poly(phenylene ether), polyamide, polyester, polycarbonate and cellulose triacetate.

These rubbery polymers and other thermoplastic resins may be used either singly or in any combination thereof. The blending amount thereof is suitably selected within limits not impeding the objects of the present invention. However, it is preferably at most 30 parts by weight per 100 parts by weight of the cyclic structure-containing thermoplastic polymer for reasons of not impeding the properties of the resulting adhesive.

(4) Other Compounding Additives

To the adhesives according to the present invention, may be added proper amounts of other compounding additives such as heat stabilizers, weathering stabilizers, leveling agents, antistatic agents, slip agents, antiblocking agents, anti-fogging agents, lubricants, dyes, pigments, natural oil, synthetic oil and wax as needed.

Specific examples thereof include phenolic antioxidants such as tetrakis[methylene-3(3,5-di-t-butyl-4-hydroxyphenyl)propionate]methane, alkyl β-(3,5-di-t-butyl-4-hydroxyphenyl)propionates and 2,2'-oxamidobis-[ethyl-3 (3,5-di-t-butyl-4-hydroxyphenyl)propionate]; phosphoric stabilizers such as trisnonylphenyl phosphate, tris(2,4-di-t-butylphenyl)phosphite and tris(2,4-di-t-butylphenyl) phosphite; fatty acid metal salts such as zinc stearate, calcium stearate and calcium 12-hydroxy-stearate; polyhydric alcohol fatty acid esters such as glycerol monostearate, glycerol monolaurate, glycerol distearate, pentaerythritol monostearate, pentaerythritol distearate and pentaerythritol tristearate; synthetic hydrotalcite; amine type antistatic agents; leveling agents for paints, such as fluorine-containing nonionic surfactants, special acrylic resin type leveling agents and silicone type leveling agents; coupling agents such as silane coupling agents, titanate coupling agents, aluminum-containing coupling agents and zircoaluminate coupling agents; plasticizers; and colorants such as pigments such as carbon black and dyes.

(Form of Adhesive)

The adhesives for semiconductor parts are adhesives comprising the cyclic structure-containing thermoplastic polymer as a base polymer and may contain various kinds of compounding additives such as a filler (inorganic filler or conductive filler) and a low-molecular weight resin in addition to the base polymer.

A form of the adhesive according to the present invention is an adhesive solution in which these components are uniformly dissolved or dispersed in an organic solvent. Examples of the solvent include aromatic hydrocarbons such as toluene, xylene and ethylbenzene; aliphatic hydrocarbons such as n-pentane, hexane and heptane; alicyclic hydrocarbons such as cyclohexane; and halogenated hydrocarbons such as chlorobenzene, dichlorobenzene and trichlorobenzene.

The solvent is used in an amount sufficient to uniformly dissolve or disperse the cyclic structure-containing thermoplastic polymer, and individual components optionally blended. The amount is controlled in such a manner that a solids concentration amounts to generally 1 to 80 wt. %, preferably 5 to 60 wt. %, more preferably 10 to 50 wt. %.

Another form of the adhesive according to the present invention is an adhesive film (including a sheet). The adhesive film for semiconductor parts can be produced by forming a film from an adhesive (including a composition) comprising the cyclic structure-containing thermoplastic polymer, and the individual components optionally blended using a casting process, melt extrusion process or the like. More specifically, the adhesive is cast or applied to a flat surface to remove the solvent by drying or the like, and the dried adhesive is separated from the flat surface to obtain a film. In the case where the solvent is removed by drying, it is preferred to select a process by which bubbling due to rapid drying is prevented. For example, the solvent may be volatilized at a low temperature to some extent and then fully volatilized at an elevated temperature.

As the flat surface, there may be used a planished metal plate, resin-made carrier film or the like. When the resin-made carrier film is used, a solvent used and drying conditions are determined giving care to the solvent resistance and heat resistance of a material for the carrier film. The adhesive film generally has a thickness of about 1 $\mu$m to 1 mm.

(Bonding Process)

Examples of a process for bonding a semiconductor part to a substrate with the adhesive according to the present invention include (1) a process comprising applying a solution of the adhesive to the surface of a substrate, drying a solvent to form an adhesive layer and then heating and pressure-bonding a semiconductor part to the adhesive layer, and (2) a process comprising laminating an adhesive film formed from the adhesive on the surface of a substrate, placing a semiconductor part on the adhesive film, bonding the semiconductor part to the substrate by heating and pressurizing the adhesive film at a temperature not lower than the glass transition temperature of the cyclic structure-containing thermoplastic polymer, and then cooling the adhesive film.

(1) Process of Applying the Adhesive

When the adhesive is applied, the adhesive is coated so as to cover all electrodes on a substrate, to which electrodes of a semiconductor part will be connected upon flip chip bonding of the semiconductor part. No particular limitation is imposed on the coating method of the adhesive. However, a screen printing method, a method by a dispenser or a method by spin coating is preferred as a method capable of applying the adhesive in a uniform thickness in a limited range on the substrate.

The adhesive may be applied to the adhesion surface of a semiconductor chip, not to the substrate. The solvent is removed from the adhesive applied by drying under heat. The adhesive layer after drying is preferable thicker than a gap between the semiconductor part and the substrate when the semiconductor part will be mounted.

The semiconductor part is bonded to the adhesive layer on the substrate formed in the above-described manner by heating and pressurizing at a temperature not lower than the glass transition temperature of the cyclic structure-containing thermoplastic polymer. At this time, an electrode of the semiconductor part comes into complete contact or into contact through conductive particles with an electrode of the substrate. Further, the adhesive layer is fully filled in a gap between the semiconductor chip and the substrate, whereby two functions of bonding the device to the substrate and protecting the electrodes can be exhibited.

(2) Process of Using the Adhesive Film

In the method of using the adhesive film, the adhesive film preformed by the above-described process is used in place of the adhesive layer formed by coating. Upon bonding, the adhesive film is held between a semiconductor part and a substrate, and bonding is conducted by heating and pressurizing at a temperature not lower than the glass transition temperature of the cyclic structure-containing thermoplastic polymer. Other processes than these processes are the same as in the bonding process by the coating.

(Semiconductor Part Package)

A product obtained by flip chip-bonding the semiconductor part to the substrate by the above-described process is used in computers, communication apparatus and the like as a semiconductor package or multi-chip module by providing an electrode thereon in such a manner that it can be further mounted on a printed wiring board of a mother board.

EXAMPLES

The present invention will hereinafter be described more specifically by the following Examples, Comparative Examples and Synthesis Examples. All designations of "part" or "parts" and "%" as will be used in these examples and the like mean part or parts by weight and wt. % unless expressly noted.

Various physical properties were determined in accordance with the following methods:

(1) The glass transition temperature (Tg) was measured in accordance with the differential scanning calorimetry (DSC method).

(2) The number average molecular weight (Mn) and weight average molecular weight (Mw) were determined in terms of polystyrene as measured by gel permeation chromatography (GPC) using toluene as a solvent unless expressly noted.

(3) The hydrogenation rate (degree of hydrogenation) in a main chain, the modification rate of a polymer and a copolymerization ratio were determined by $^1$H-NMR. The modification rate was calculated out in accordance with the above-described equation (1).

(4) The dielectric constant and dielectric loss tangent were determined at 1 MHz in accordance with JIS C 6481.

(5) The adhesive strength was determined by using an adhesive sample to join (bond) strip-like glass epoxy substrates to each other under heating conditions of 190° C. The joined area is 20×20 mm. This bonded sample was used to measure shear strength by a tensile tester. The shear strength was expressed as adhesive strength.

(6) A temperature cycle test (TCT) was conducted by using the above-described bonded sample and repeating a temperature cycle of −55° C. (30 min)→room temperature (5 min)→150° C. (30 min)→room temperature (5 min) 300 times to apply temperature shock to the test sample, thereby investigating whether failure (separation) occurred or not.

A pressure cooker test (PCT) was conducted by leaving a test sample to stand for 300 hours under an environment of 100% in humidity and 105° C. to investigate whether failure occurred or not.

In each case, the test sample was evaluated in accordance with the following standard:
  ○: No failure occurred;
  ×: Failure occurred.

Synthesis Example 1

Tungsten hexachloride, triisobutylaluminum and isobutyl alcohol were used as a polymerization catalyst to subject 8-ethyltetracyclo[$4.4.1^{2,5}.1^{7,10}.0$]-3-dodecene (hereinafter referred to as "ETD") to ring-opening polymerization in a publicly known process. The thus-obtained ring-opening polymer was hydrogenated using nickel acetylacetonate and triisobutylaluminum in a publicly known process to obtain a hydrogenated product (hydrogenation rate $\geq 99\%$, Tg=138° C., Mn=18,500, Mw=31,600) of the ring-opening polymer of ETD. With 100 parts of the hydrogenated product were mixed 15 parts of allyl alcohol, 5 parts of dicumyl peroxide and 300 parts of tert-butylbenzene to conduct a reaction at 150° C. for 4 hours in an autoclave. The reaction mixture was then poured into 300 parts of methanol to solidify a reaction product. The solidified product was dried to obtain an alcohol-modified polymer (A). The result of the synthesis is shown in Table 1.

Synthesis Example 2

A silane-modified polymer (B) was obtained in the same manner as in Synthesis Example 1 except that 15 parts of allyl alcohol were changed to 20 parts of trimethoxyvinylsilane. The silane-modified polymer is hydrolyzed to have a silanol group. The result of the synthesis is shown in Table 1.

Synthesis Example 3

A maleic anhydride-modified polymer was obtained in the same manner as in Synthesis Example 1 except that 15 parts of allyl alcohol were changed to 2 parts of maleic anhydride. One part of water and 1 part of triethylamine were added to 100 parts of the thus-obtained polymer to conduct a hydrolytic reaction at 150° C. for 1 hour, thereby obtaining a maleic acid-modified polymer (C). The result of the synthesis is shown in Table 1.

Synthesis Example 4

An epoxy-modified polymer (D) was obtained in the same manner as in Synthesis Example 1 except that 15 parts of allyl alcohol were changed to 15 parts of allyl glycidyl ether (AGE). The result of the synthesis is shown in Table 1.

Synthesis Example 5

VO(OC$_2$H$_5$)Cl$_2$ and ethylaluminum sesquichloride [Al(C$_2$H$_5$)$_{1.5}$Cl$_{1.5}$] were used as a polymerization catalyst to polymerize tetracyclo[$4.4.1^{2,5}.1^{7,10}.0$]-3-dodecene (hereinafter referred to as "TCD") and ethylene in accordance with a publicly known process, thereby obtaining an addition copolymer. With 100 parts of the thus-obtained copolymer were mixed 15 parts of allyl alcohol, 5 parts of dicumyl peroxide and 300 parts of tert-butylbenzene to conduct a reaction at 150° C. for 4 hours in an autoclave. A reaction product was solidified from the reaction mixture and dried in the same manner as described above to obtain an alcohol-modified polymer (E). The result of the synthesis is shown in Table 1.

Synthesis Example 6

A silane-modified polymer (F) was obtained in the same manner as in Synthesis Example 5 except that 15 parts of allyl alcohol were changed to 20 parts of trimethoxyvinylsilane. The result of the synthesis is shown in Table 1.

Synthesis Example 7

A maleic anhydride-modified polymer was obtained in the same manner as in Synthesis Example 5 except that 15 parts of allyl alcohol were changed to 2 parts of maleic anhydride. One part of water and 1 part of triethylamine were added to 100 parts of the thus-obtained polymer to conduct a hydrolytic reaction at 150° C. for 1 hour, thereby obtaining a maleic acid-modified polymer (G). The result of the synthesis is shown in Table 1.

Synthesis Example 8

An epoxy-modified polymer (H) was obtained in the same manner as in Synthesis Example 5 except that 15 parts of allyl alcohol were changed to 15 parts of allyl glycidyl ether. The result of the synthesis is shown in Table 1.

Synthesis Example 9

A Li type living anionic polymerization catalyst [n-BuLi/tetramethylenediamine (TMEDA: living anionic stabilizer)=1/1 (molar ratio)] described in Japanese Patent Application Laid-Open No. 258318/1995 was used to polymerize 1,3-cyclohexadiene (C-HD), thereby obtaining a 1,4-addition polymer. This addition polymer was hydrogenated to obtain a hydrogenated product (hydrogenation rate $\geq 99\%$, Tg=219° C., Mn=53,400, Mw=78,000).

With 100 parts of the thus-obtained hydrogenated polymer were mixed 15 parts of allyl alcohol, 5 parts of dicumyl peroxide and 300 parts of tert-butylbenzene to conduct a reaction at 150° C. for 4 hours in an autoclave. A reaction product was solidified from the reaction mixture and dried in the same manner as described above to obtain an alcohol-modified polymer (I). The result of the synthesis is shown in Table 1.

Synthesis Example 10

A silane-modified polymer (J) was obtained in the same manner as in Synthesis Example 9 except that 15 parts of allyl alcohol were changed to 20 parts of trimethoxyvinylsilane. The result of the synthesis is shown in Table 1.

Synthesis Example 11

A maleic anhydride-modified polymer was obtained in the same manner as in Synthesis Example 9 except that 15 parts of allyl alcohol were changed to 2 parts of maleic anhydride. One part of water and 1 part of triethylamine were added to 100 parts of the thus-obtained polymer to conduct a hydrolytic reaction at 150° C. for 1 hour, thereby obtaining a maleic acid-modified polymer (K). The result of the synthesis is shown in Table 1.

Synthesis Example 12

An epoxy-modified polymer (L) was obtained in the same manner as in Synthesis Example 9 except that 15 parts of allyl alcohol were changed to 15 parts of allyl glycidyl ether. The result of the synthesis is shown in Table 1.

Synthesis Example 13

After 100 parts of poly(2,6-dimethyl-1,4-phenylene ether; PPE) having a number average molecular weight (Mn) of 9,200, 1.5 parts of maleic anhydride and 1.0 part of 2,5-dimethyl-2,5-di(t-butyl peroxy)hexane (Perhexa 25B, product of Nippon Oil & Fats Co., Ltd.) were dry blended at room temperature, the resultant blend was extruded from a twin-screw extruder under conditions of a cylinder temperature of 300° C. and a screw speed of 230 rpm to obtain a maleic anhydride-modified poly(phenylene ether) (PPE) (M). The result of the synthesis is shown in Table 1.

Solder particles were further blended as conductive particles in a proportion of 3 parts by weight per 100 parts by weight of the base polymer. Each of the resultant solutions was formed into a thin film on a polytetra-fluoroethylene plate having a thickness of 3 mm using a spin coater to dry the thin film at 150° C. for 1 hour in nitrogen. The adhesive strength of this film on the preparation and after stored for 6 months is shown in Table 2.

The film thus obtained was placed on a glass epoxy substrate, and a semiconductor part (100-µm pitch, 360 pins) comprising silicon as a substrate was bonded to the film by heating and pressurizing at 190° C. for 5 seconds from the above. The thus-obtained sample was investigated as to whether failure occurred or not in temperature cycle tests (TCT) and pressure cooker tests (PCT) on the preparation and after 6 months. The evaluation results are shown in Table 2. In each test, excellent results were exhibited.

Example 18

A hydrogenated product (ARTON, product of Japan Synthetic Rubber Co., Ltd.; Mn=17,600, Mw=57,700, identified

TABLE 1

| | Polymer | | | | | Modified polymer | | | | | | | |
|---|---|---|---|---|---|---|---|---|---|---|---|---|---|
| | Composition (molar ratio) | Polymerization system | Hydrogenation rate (%) | Tg (° C.) | Mn (×10⁴) | Mw (×10⁴) | Modifying group | Modification rate (mol %) | Tg (° C.) | Mn (×10⁴) | Mw (×10⁴) | Water absorptivity (%) | Dielectric constant (ε) | Dielectric loss tangent (tan δ) | Code |
| Syn. Ex. 1 | ETD | Ring-opening | ≧99 | 138 | 1.85 | 3.16 | Alcohol | 8 | 140 | 1.75 | 3.19 | 0.03 | 2.45 | 0.001 | A |
| Syn. Ex. 2 | ETD | Ring-opening | ≧99 | 138 | 1.85 | 3.16 | Silanol | 11 | 131 | 1.81 | 3.36 | 0.01 | 2.34 | 0.001 | B |
| Syn. Ex. 3 | ETD | Ring-opening | ≧99 | 138 | 1.85 | 3.16 | Maleic acid | 2 | 154 | 1.77 | 2.91 | 0.01 | 2.38 | 0.0005 | C |
| Syn. Ex. 4 | ETD | Ring-opening | ≧99 | 138 | 1.85 | 3.16 | Epoxy | 7 | 150 | 1.75 | 2.99 | 0.02 | 2.41 | 0.001 | D |
| Syn. Ex. 5 | TCD/ethylene (38/62) | Addition | — | 135 | 1.52 | 3.56 | Alcohol | 8 | 135 | 1.44 | 3.74 | 0.01 | 2.38 | 0.001 | E |
| Syn. Ex. 6 | TCD/ethylene (38/62) | Addition | — | 135 | 1.52 | 3.56 | Silanol | 9 | 129 | 1.43 | 3.87 | 0.01 | 2.36 | 0.001 | F |
| Syn. Ex. 7 | TCD/ethylene (38/62) | Addition | — | 135 | 1.52 | 3.56 | Maleic acid | 2 | 148 | 1.42 | 3.41 | 0.03 | 2.37 | 0.0005 | G |
| Syn. Ex. 8 | TCD/ethylene (38/62) | Addition | — | 135 | 1.52 | 3.56 | Epoxy | 6 | 145 | 1.52 | 3.72 | 0.02 | 2.40 | 0.001 | H |
| Syn. Ex. 9 | C-HD | Addition | ≧99 | 219 | 5.34 | 7.80 | Alcohol | 9 | 220 | 4.92 | 7.99 | 0.01 | 2.38 | 0.001 | I |
| Syn. Ex. 10 | C-HD | Addition | ≧99 | 219 | 5.34 | 7.80 | Silanol | 8 | 207 | 0.55 | 0.95 | 0.01 | 2.34 | 0.001 | J |
| Syn. Ex. 11 | C-HD | Addition | ≧99 | 219 | 5.34 | 7.80 | Maleic acid | 2 | 225 | 1.68 | 2.79 | 0.03 | 2.40 | 0.0007 | K |
| Syn. Ex. 12 | C-HD | Addition | ≧99 | 219 | 5.34 | 7.80 | Epoxy | 5 | 223 | 0.85 | 1.54 | 0.02 | 2.40 | 0.001 | L |
| Syn. Ex. 13 | PPE | — | — | 178 | 0.92 | 1.33 | Maleic acid | 1 | 183 | 0.85 | 1.54 | 0.10 | 3.05 | 0.01 | M |

(Note)
(1) ETD: Ethyltetracyclododecene,
(2) TCD: Tetracyclododecene,
(3) C-HD: 1,3-Cyclohexadiene,
(4) PPE: Poly(phenylene ether).

Examples 1 to 17

Silica particles (particle diameter: 0.01 µm) and a bisphenol F type epoxy resin were added to each of the polymers obtained in Synthesis Examples 1 to 13 in their corresponding blending proportion shown in Table 2, and the thus-obtained products were separately dissolved in xylene in such a manner that the resin content amounted to 30%.

the absorption of carbonyl by a Fourier transform infrared spectroscopy, Tg=171° C., water absorptivity: 0.2%, dielectric constant: 3.24, dielectric loss tangent: 0.022) of a functional group-containing norbornene ring-opening polymer was used as a base polymer to prepare an adhesive composition and a sample in a blending proportion shown in Table 2, thereby performing the measurement of adhesive strength, temperature cycle tests and pressure cooker tests on the preparation and after stored for 6 months to confirm that no problem arose. The results are shown in Table 2.

Comparative Examples 1 to 3

A bisphenol F type epoxy resin was used as a principal agent (base polymer) for an adhesive, and 5 pats of 2-ethyl-4-methylimidazole were added as a hardener to this polymer to prepare an adhesive. The measurement of adhesive strength, temperature cycle tests and pressure cooker tests were performed under their corresponding conditions shown in Table 2 in a manner similar to Examples 1 to 18. As a result, satisfactory results were yielded in only an adhesive that the curing time was set to 60 seconds. Accordingly, it has been found that the epoxy resin involved a problem of productivity because the curing rate was low. After 6 months, the same tests were intended to perform. However, the samples had been completely cured.

are shown in Table 3. Excellent results were exhibited. The method of the high-temperature and high-humidity test is shown after Table 3.

Examples 20 to 23

Sheets were prepared in the same manner as in Example 19 except that the respective polymers and conductive fillers shown in Table 3 were used in their corresponding blending proportions shown in Table 3 to conduct the high-temperature and high-humidity test. The evaluation results are shown in Table 3. All the samples exhibited excellent results.

Example 24

Ni particles having an average particle diameter of 7 μm were mixed with an acrylic/styrene resin in a proportion of 5:100, and the resultant mixture was treated for 10 minutes at a revolving speed of 16,200 rpm by means of a hybrid-

TABLE 2

| | Polymer (part) | Filler Kind | Filler Amount added (part) | Compounding additive Kind | Compounding additive Amount added (part) | Bonding conditions Temp. (° C.) | Bonding conditions Time (sec) | On formation of film Adhesive strength (kg/cm²) | On formation of film TCT | On formation of film PCT | 6 months after formation of film Adhesive strength (kg/cm²) | 6 months after formation of film TCT | 6 months after formation of film PCT |
|---|---|---|---|---|---|---|---|---|---|---|---|---|---|
| Ex. 1 | A (100) | — | — | — | — | 190 | 5 | 105 | ○ | ○ | 105 | ○ | ○ |
| Ex. 2 | A (100) | Silica | 20 | Epoxy | 20 | 190 | 5 | 110 | ○ | ○ | 110 | ○ | ○ |
| Ex. 3 | B (100) | — | — | — | — | 190 | 5 | 100 | ○ | ○ | 100 | ○ | ○ |
| Ex. 4 | B (100) | Silica | 20 | Epoxy | 20 | 190 | 5 | 100 | ○ | ○ | 100 | ○ | ○ |
| Ex. 5 | C (100) | — | — | — | — | 190 | 5 | 135 | ○ | ○ | 125 | ○ | ○ |
| Ex. 6 | C (100) | Silica | 20 | Epoxy | 20 | 190 | 5 | 135 | ○ | ○ | 140 | ○ | ○ |
| Ex. 7 | D (100) | — | — | — | — | 190 | 5 | 100 | ○ | ○ | 110 | ○ | ○ |
| Ex. 8 | D (100) | Silica | 20 | Epoxy | 20 | 190 | 5 | 100 | ○ | ○ | 100 | ○ | ○ |
| Ex. 9 | E (100) | Silica | 20 | Epoxy | 20 | 190 | 5 | 95 | ○ | ○ | 90 | ○ | ○ |
| Ex. 10 | F (100) | Silica | 20 | Epoxy | 20 | 190 | 5 | 95 | ○ | ○ | 100 | ○ | ○ |
| Ex. 11 | G (100) | Silica | 20 | Epoxy | 20 | 190 | 5 | 120 | ○ | ○ | 130 | ○ | ○ |
| Ex. 12 | H (100) | Silica | 20 | Epoxy | 20 | 190 | 5 | 100 | ○ | ○ | 100 | ○ | ○ |
| Ex. 13 | I (100) | Silica | 20 | Epoxy | 20 | 190 | 5 | 95 | ○ | ○ | 105 | ○ | ○ |
| Ex. 14 | J (100) | Silica | 20 | Epoxy | 20 | 190 | 5 | 100 | ○ | ○ | 95 | ○ | ○ |
| Ex. 15 | K (100) | Silica | 20 | Epoxy | 20 | 190 | 5 | 125 | ○ | ○ | 125 | ○ | ○ |
| Ex. 16 | L (100) | Silica | 20 | Epoxy | 20 | 190 | 5 | 90 | ○ | ○ | 90 | ○ | ○ |
| Ex. 17 | M (100) | Silica | 20 | Epoxy | 20 | 190 | 5 | 75 | ○ | ○ | 80 | ○ | ○ |
| Ex. 18 | ARTON (100) | Silica | 40 | Epoxy | 20 | 190 | 5 | 120 | ○ | ○ | 120 | ○ | ○ |
| Comp. Ex. 1 | Epoxy (100) | Silica | 20 | 2E4MZ | 5 | 190 | 5 | 10 | X | X | — | X | X |
| Comp. Ex. 2 | Epoxy (100) | Silica | 20 | 2E4MZ | 5 | 190 | 30 | 70 | X | X | — | X | X |
| Comp. Ex. 3 | Epoxy (100) | Silica | 20 | 2E4MZ | 5 | 190 | 60 | 150 | ○ | ○ | — | X | X |

(Note)
(1) Epoxy: Bisphenol F type epoxy resin,
(2) 2E4MZ: 2-Ethyl-4-methylimidazole.

Example 19

Ni particles (Conductive filler ①) having an average particle diameter of 7 μm were added to 100 parts of the polymer (A) obtained in Synthesis Example 1 in its corresponding blending proportion shown in Table 3, and the thus-obtained product was dissolved in xylene in such a manner that the resin content amounted to 30%. This solution was used to form a sheet having a thickness of 50 to 70 μm. The sheet thus obtained was placed on a glass epoxy substrate, and a semiconductor part (125-μm pitch, 360 pins) comprising silicon as a substrate was bonded to the film by heating and pressurizing at 200° C. for 30 seconds from the above. The thus-obtained sample was subjected to a high-temperature and high-humidity test. The evaluation results ization system (manufactured by Nara Machinery Co., Ltd.) to obtain a microcapsulated conductive filler ④ in which a film having a thickness of 0.1 to 0.2 μm had been formed on the Ni particles.

A sheet was prepared in the same manner as in Example 19 except that this conductive filler ④ was used, to conduct the high-temperature and high-humidity test. The evaluation results are shown in Table 3. Excellent results were exhibited.

Example 25

Particles obtained by subjecting silica having an average particle diameter of 5 μm to Ni/Au plating were used to obtain a microcapsulated conductive filler ⑤, in which a film of an acrylic/styrene resin having a thickness of 0.1 to 0.2 μm had been formed on the particles, in a manner similar to Example 24.

A sheet was prepared in the same manner as in Example 19 except that this conductive filler ⑤ was used, to conduct the high-temperature and high-humidity test. The evaluation results are shown in Table 3. Excellent results were exhibited.

Example 26

Particles obtained by subjecting benzoguanamine resin (Bright 20GNRY4.6EH, product of Nippon Kagakusha K.K.) having an average particle diameter of 5 μm to Ni/Au plating were used to obtain a microcapsulated conductive filler ⑥, in which a film of an acrylic/styrene resin having a thickness of 0.1 to 0.2 μm had been formed on the particles, in a manner similar to Example 24.

A sheet was prepared in the same manner as in Example 19 except that this conductive filler ⑥ was used, to conduct the high-temperature and high-humidity test. The evaluation results are shown in Table 3. Excellent results were exhibited.

Comparative Examples 4 to 6

To 80 parts by weight of toluene were added 100 parts by weight of an epoxy resin (Epicoat 1009, product of Yuka Shell Epoxy Kabushlkikaisha) and 170 parts by weight of HX3941HP as a hardener to prepare an epoxy resin varnish.

Their corresponding conductive fillers shown in Table 3 were separately blended with this epoxy resin varnish to prepare sheets in a semicured state in the same manner as in Example 19. The thus-prepared sheet before subjected to hard baking was used to press-bond a semiconductor part to a glass epoxy substrate in the same manner as in Example 19. The evaluation results are shown in Table 3. In all the samples, the connection resistance values after the high-temperature and high-humidity test were at least 50Ω, which caused a failure in electrical connection.

TABLE 3

| | Polymer | Conductive filler | | High-temperature and high-humidity test | |
|---|---|---|---|---|---|
| | (part) | Kind | (part) | Initial | After 1000 hr. |
| Ex. 19 | A (100) | ① | 20 | ◎ | ◎ |
| Ex. 20 | C (100) | ② | 5 | ◎ | ◎ |
| Ex. 21 | C (100) | ③ | 5 | ◎ | ◎ |
| Ex. 22 | E (100) | ① | 20 | ◎ | ◎ |
| Ex. 23 | J (100) | ① | 20 | ◎ | ○ |
| Ex. 24 | A (100) | ④ | 20 | ◎ | ◎ |
| Ex. 25 | A (100) | ⑤ | 20 | ◎ | ◎ |
| Ex. 26 | A (100) | ⑥ | 20 | ◎ | ◎ |
| Comp. Ex. 4 | Epoxy (100) | ① | 20 | ◎ | X |
| Comp. Ex. 5 | Epoxy (100) | ② | 5 | ◎ | X |
| Comp. Ex. 6 | Epoxy (100) | ③ | 5 | ◎ | X |

(Note)
(1) The high-temperature and high-humidity test was conducted by leaving a sample to stand for 1,000 hours in an environment of 100% in humidity and 105° C. in temperature, thereby determining the degree of rise in the connection resistance value to evaluate it in accordance with the following standard:
<Initial>
◎: Not higher than 10 Ω,
○: Not higher than 20 Ω, TABLE 3-continued

| | Polymer | Conductive filler | | High-temperature and high-humidity test | |
|---|---|---|---|---|---|
| | (part) | Kind | (part) | Initial | After 1000 hr. |

Δ: Not higher than 30 Ω,
X: At least 50 Ω.
<After PCT>
◎: Not higher than 10 Ω,
○: Not higher than 20 Ω,
Δ: Not higher than 30 Ω,
X: At least 50 Ω.
(2) Conductive filler:
Conductive filler ①: Ni particles having an average particle diameter of 7 μm;
Conductive filler ②: Particles obtained by subjecting silica having an average particle diameter of 5 μm to Ni/Au plating;
Conductive filler ③: Particles obtained by subjecting benzoguanamine resin (Bright 20GNRY4.6EH, product of Nippon Kagakusha K.K.) having an average particle diameter of 5 μm to Ni/Au plating;
Conductive filler ④: Microcapsulated conductive filler;
Conductive filler ⑤: Microcapsulated conductive filler;
Conductive filler ⑥: Microcapsulated conductive filler.

INDUSTRIAL APPLICABILITY

According to the present invention, there are provided adhesives suitable for use in flip chip bonding of semiconductor parts in particular and excellent in shelf stability, productivity, strength properties and heat resistance, and electronic part packages making use of such an adhesive. The adhesives according to the present invention are excellent in electrical properties such as dielectric constant and dielectric loss tangent, and moisture resistance, and moreover excellent in adhesive property to semiconductor chips, packaging boards and the like. The adhesives for semiconductor parts according to the present invention are useful in a wide variety of fields, in particular, as adhesives for semiconductor packages, of which speeding up and high reliability are required, in fields of electric and electronic apparatus.

What is claimed is:

1. An anisotropic electrically conductive adhesive for semiconductor parts, comprising:
   a cyclic structure-containing thermoplastic polymer selected from the group consisting of (a) a cycloolefin polymer and (b) an aromatic-condensed polymer having a repeating unit of an aromatic ring in its main chain, and having a number average molecular weight of 1,000 to 500,000, and
   an electrically conductive filler,
   whereby the adhesive has anisotropic electrical conductivity and wherein the cyclic structure-containing thermoplastic polymer has a functional group selected from the group consisting of an alcohol group, epoxy group, carboxyl group, acid anhydride group and silanol group.

2. The adhesive for semiconductor parts according to claim 1, wherein the cyclic structure-containing thermoplastic polymer has the functional group in a proportion of 5 to 100 mol % based on the total number of monomer units in the polymer.

3. The adhesive for semiconductor parts according to claim 2, wherein the cyclic structure-containing thermoplastic polymer is a modified polymer obtained by graft-modifying, with a functional group-containing unsaturated compound,
   a hydrogenated product of a ring-opening copolymer of tetracyclododecene or a derivative thereof, an addition copolymer of tetracyclododecene or a derivative thereof and a vinyl compound, or a hydrogenated product of an addition polymer of 1,3-cyclohexadiene.

4. The adhesive for semiconductor parts according to claim 1, wherein the cyclic structure-containing thermoplastic polymer is at least one thermoplastic norbornene resin selected from the group consisting of (1) an addition (co)polymer of an alicyclic monomer having a norbornene ring, (2) an addition copolymer of an alicyclic monomer having a norbornene ring and a vinyl compound, (3) a ring-opening (co)polymer of an alicyclic monomer having a norbornene ring, and (4) a hydrogenated product of the ring-opening (co)polymer of the alicyclic monomer having a norbornene ring.

5. The adhesive for semiconductor parts according to claim 1, wherein the cyclic structure-containing thermoplastic polymer is at least one selected from the group consisting of an addition polymer of a cyclic conjugated diene monomer and a hydrogenated product of the addition polymer.

6. The adhesive for semiconductor parts according to claim 1, wherein the cyclic structure-containing thermoplastic polymer is poly(phenylene ether).

7. The adhesive for semiconductor parts according to claim 1, wherein the amount of the conductive filler is 1 to 100 parts by weight based on 100 parts by weight of the cyclic structure-containing thermoplastic polymer.

8. The adhesive for semiconductor parts according to claim 1, wherein the filler is a micro-capsulate conductive filler.

9. The adhesive for semiconductor parts according to claim 1, further comprising a low-molecular weight resin in a proportion of 1 to 50 parts by weight per 100 parts by weight of the cyclic structure-containing thermoplastic polymer.

10. The adhesive for semiconductor parts according to claim 9, wherein the low-molecular weight resin is an epoxy resin.

11. The adhesive for semiconductor parts according to claim 9, wherein the amount of the conductive filler is 1 to 100 parts by weight based on 100 parts by weight of the cyclic structure-containing thermoplastic polymer.

12. The adhesive for semiconductor parts according to claim 1 wherein the glass transition temperature of the cyclic structure-containing thermoplastic polymer is at least 100° C.

13. The adhesive for semiconductor parts according claim 1, wherein the filler has an average particle diameter of (length+breadth)/2 in the range of 0.1 to 30 µm.

14. The adhesive for semiconductor parts according claim 1, wherein the filler has an average particle diameter of (length+breadth)/2 in the range of 1 to 20 µm.

15. The adhesive for semiconductor parts according claim 1, wherein the filler has an average particle diameter of (length+breadth)/2 in the range of 5 to 15 µm.

16. The adhesive for semiconductor parts according claim 1, wherein the cyclic structure-containing thermoplastic polymer has a number average molecular weight of 3,000 to 300,000.

17. The adhesive for semiconductor parts according claim 1, wherein the cyclic structure-containing thermoplastic polymer has a number average molecular weight of 5,000 to 250,000.

18. The adhesive for semiconductor parts according claim 1, wherein the amount of the conductive filler is 2 to 70 parts by weight based on 100 parts by weight of the cyclic structure-containing thermoplastic polymer.

19. The adhesive for semiconductor parts according claim 1, wherein the amount of the conductive filler is 3 to 50 parts by weight based on 100 parts by weight of the cyclic structure-containing thermoplastic polymer.

20. A semiconductor part package obtained by bonding a semiconductor part to a substrate with a solution or film of the adhesive according to claim 1.

21. An adhesive film for semiconductor parts, which is obtained by forming a film from the adhesive according to claim 1.

22. The adhesive film according to claim 21, which has a thickness of about 1 µm to 1 mm.

23. A process for producing a semiconductor part package, which comprises laminating the adhesive film according to claim 21 on the surface of a substrate, placing a semiconductor part on the adhesive film, bonding the semiconductor part to the substrate by heating and pressurizing the adhesive film at a temperature not lower than the glass transition temperature of the cyclic structure-containing thermoplastic polymer, and then cooling the adhesive film.

24. A process for producing a semiconductor part package, which comprises applying a solution of the adhesive according to claim 1 to the surface of a substrate, drying a solvent to form an adhesive layer, placing a semiconductor part on the adhesive layer, bonding the semiconductor part to the substrate by heating and pressurizing the adhesive layer at a temperature not lower than the glass transition temperature of the cyclic structure-containing thermoplastic polymer, and then cooling the adhesive layer.

25. A process for producing a semiconductor part package, which comprises laminating the adhesive film according to claim 21 on the surface of a substrate having an electrode (A) thereon, placing a semiconductor part on the adhesive film, bonding the semiconductor part having an electrode (B) to the substrate to electrically connect the electrode (A) with the electrode (B), by heating and pressurizing the adhesive film at a temperature not lower than the glass transition temperature of the cyclic structure-containing thermoplastic polymer, and then cooling the adhesive film.

26. A process for producing a semiconductor part package, which comprises applying a solution of the adhesive according to claim 1 on the surface of a substrate having an electrode (A) thereon, drying a solvent from the solution to form an adhesive layer, placing a semiconductor part on the adhesive layer, bonding the semiconductor part having an electrode (B) to the substrate to electrically connect the electrode (A) with the electrode (B), by heating and pressurizing the adhesive layer at a temperature not lower than the glass transition temperature of the cyclic structure-containing thermoplastic polymer, and then cooling the adhesive layer.

* * * * *

UNITED STATES PATENT AND TRADEMARK OFFICE
CERTIFICATE OF CORRECTION

PATENT NO.    : 6,833,180 B1
DATED         : December 21, 2004
INVENTOR(S)   : Junji Kodemura It is certified that error appears in the above-identified patent and that said Letters Patent is hereby corrected as shown below:

Column 29,
Lines 47, 50, 53, 56 and 60, change "according claim" to -- according to claim --.

Column 30,
Lines 1 and 5, change "according claim" to -- according to claim --.

Signed and Sealed this

Thirteenth Day of September, 2005

JON W. DUDAS
*Director of the United States Patent and Trademark Office*